United States Patent
Oikawa

(10) Patent No.: US 6,459,157 B1
(45) Date of Patent: Oct. 1, 2002

(54) SEMICONDUCTOR DEVICE AND DOUBLE-SIDED MULTI-CHIP PACKAGE

(75) Inventor: Kiyoharu Oikawa, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/487,674

(22) Filed: Jan. 20, 2000

(30) Foreign Application Priority Data

Jan. 22, 1999 (JP) .............................. 11-014784

(51) Int. Cl.$^7$ ..................... H01L 27/04; H01L 23/495; H01L 23/34; H01L 23/48; H01L 23/52
(52) U.S. Cl. ..................... 257/777; 257/774; 257/773; 257/685; 257/686; 257/723; 257/628; 257/208; 257/203; 257/207; 257/211; 257/691; 257/690; 257/693; 257/692; 257/697
(58) Field of Search ................ 257/778, 777, 257/774, 685, 686, 723, 680, 668, 702, 701, 693, 692, 691, 690, 773, 208, 203, 207, 210, 699

(56) References Cited

U.S. PATENT DOCUMENTS

| | | | |
|---|---|---|---|
| 5,719,436 A | | 2/1998 | Kuhn .......................... 257/676 |
| 5,800,184 A | * | 9/1998 | Lopergolo et al. ............. 29/593 |
| 5,841,190 A | * | 11/1998 | Noda et al. ................. 257/678 |
| 5,986,893 A | * | 11/1999 | Leigh et al. ................. 361/777 |
| 6,100,581 A | * | 8/2000 | Wakefield et al. ........... 257/692 |
| 6,137,164 A | * | 10/2000 | Yew et al. ................... 257/686 |
| 6,243,272 B1 | * | 6/2001 | Zeng et al. .................. 257/698 |
| 6,256,206 B1 | * | 7/2001 | Van Campenhout ........ 361/760 |
| 6,262,362 B1 | * | 7/2001 | Czakowski et al. ......... 257/699 |
| 6,262,488 B1 | * | 7/2001 | Masayuki et al. .......... 257/777 |
| 2001/0003375 A1 | * | 6/2001 | Kovats et al. ............... 257/685 |

FOREIGN PATENT DOCUMENTS

| | | | | |
|---|---|---|---|---|
| JP | 63281450 | | 11/1988 | |
| JP | 6-13536 | * | 6/1994 | ................. 257/929 |

* cited by examiner

Primary Examiner—Alexander O. Williams
(74) Attorney, Agent, or Firm—Oblon, Spivak, McClelland, Maier & Neustadt, P.C.

(57) ABSTRACT

A semiconductor device has a circuit board, a main chip mounted on a first surface of the circuit board, a subchip mounted on a second surface of the circuit board, interface circuits distributed in the main chip along four sides of the main chip, respectively, to interface the main chip and the subchip with each other, subchip connecting terminals for connecting the interface circuits and the subchip to each other through the circuit board, main-chip connecting terminals for connecting the main chip and the outside to each other, subchip bonding terminals connected to the subchip, a first wiring area for connecting the subchip bonding terminals and the subchip connecting terminals to each other, package terminals for connecting the main chip and the outside to each other, and a second wiring area for connecting the package terminals and the main-chip connecting terminals to each other.

24 Claims, 4 Drawing Sheets

SEMICONDUCTOR DEVICE AND DOUBLE-SIDED MULTI-CHIP PACKAGE

BACKGROUND OF THE INVENTION

1. Field of the Invention

The present invention relates to a semiconductor device with a double-sided multi-chip package having chips of different functions mounted on each side of a circuit board. In particular, the present invention relates to a semiconductor device with a double-sided multi-chip package having chips on each side of a circuit board and distributed interface circuits for interfacing the chips with each other. The distributed interface circuits make the wiring designing of the circuit board easier.

2. Description of the Prior Art

FIG. 1 shows the top of a double-sided multi-chip package (MCP) device according to a prior art, and FIG. 2 shows the bottom thereof. The MCP device consists of a circuit board 51. The top surface of the circuit board 51 has a main chip 52, and the bottom surface thereof has an intellectual property (IP) chip 53. The main chip 52 contains an interface circuit 54 along a side of the main chip 52, to interface the main chip 52 and IP chip 53 with each other. Main-chip connecting terminals 55 are arranged around the main chip 52 on each side of the circuit board 51, to connect the main chip 52 to the bottom face of the circuit board 51 through the circuit board 51. The terminals 55 on the top surface of the circuit board 51 are connected to the main chip 52. Among the terminals 55, some are interfacing terminals 55a, which are arranged along the interface circuit 54 and are exclusively used by the interface circuit 54.

IP chip bonding terminals 56 are arranged on the bottom surface of the circuit board 51 around the IP chip 53 and are connected to the IP chip 53 with bonding wires. A wiring area 57 is formed between the terminals 56 and the terminals 55 and is used to connect the terminals 56 to the terminals 55a dedicated to the interface circuit 54. Package terminals 58 are arranged along the periphery of the bottom surface of the circuit board 51, to connect the double-sided MCP device to the outside. A wiring area 59 is formed between the terminals 58 and the terminals 55, to connect the terminals 55, except the terminals 55a, to the terminals 58.

According to this arrangement, the interface circuit 54 in the main chip 52 is collectively arranged along a side of the main chip 52, and therefore, the terminals 55a connected to the interface circuit 54 must be arranged in the vicinity of the side in question of the main chip 52. This widens differences among wire lengths in the wiring area 57 to connect the terminals 56 to the terminals 55a. This results in unbalancing wiring capacitance and resistance, complicating the optimization of the wiring capacitance and resistance, and making the designing of a circuit board difficult. At the center of the wiring area 57 on the bottom surface of the circuit board 51, wires must densely be arranged for the terminals 55a, to increase the size of the wiring area 57, thus increasing the size of the circuit board 51.

In addition, the terminals 55a for the interface circuit 54 are collectively arranged along a side of the circuit board 51 corresponding to the interface side of the main chip 52. As a result, only three sides around the IP chip 53 are available on the bottom surface of the circuit board 51 for arranging the terminals 55 to be connected to the terminals 58. This widens differences among wire lengths in the wiring area 59 to connect the terminals 55 to the terminals 58. This results in congesting wires in the wiring area 59 in the vicinity of the terminals 55a, thereby causing the problem mentioned above.

In this way, the prior art arranges an interface circuit along a side of a main chip to vary the lengths of wires for connecting main-chip connecting terminals, IP-chip connecting terminals, and package terminals. This complicates the optimization of wire lengths and makes the designing of a circuit board difficult. The prior art requires wires to be densely arranged, to thereby enlarge a wiring area and increasing the size of a circuit board.

SUMMARY OF THE INVENTION

An object of the present invention is to provide a semiconductor device with a double-sided multi-chip package that makes the designing of wiring between chips and terminals easier and improves wiring characteristics.

In order to accomplish the object, the present invention provides a semiconductor device having a circuit board, a main chip mounted on a first surface of the circuit board, a subchip mounted on a second surface of the circuit board, and interface circuits distributed in the main chip along four sides of the main chip, respectively, to interface the main chip and subchip with each other.

The semiconductor device may have subchip connecting terminals arranged around the main chip opposite to the interface circuits on each surface of the circuit board, to connect the interface circuits and the subchip to each other through the circuit board, main-chip connecting terminals arranged around the main chip at positions where the subchip connecting terminals are not present on each surface of the circuit board, to connect the main chip and the outside to each other, subchip bonding terminals arranged around the subchip on the second surface of the circuit board and connected to the subchip, and a first wiring area for connecting the subchip bonding terminals and the subchip connecting terminals to each other.

The semiconductor device may have package terminals arranged along the periphery of the circuit board, to connect the main chip and the outside to each other, and a second wiring area for connecting the package terminals and the main-chip connecting terminals to each other.

The interface circuits may be arranged at central parts of the four sides of the main chip, respectively. The package terminals may be arranged on the second surface of the circuit board.

According to the present invention, the interface circuits in the main chip are distributed along the four sides of the main chip, and the subchip connecting terminals are also distributed along the four sides of the main chip, to face the interface circuits. The first wiring area is distributed along the periphery of the subchip, to reduce the lengths of wires in the first wiring area and make the designing of wiring easier. The second wiring area is distributed along the periphery of the subchip, to make wiring easier. Consequently, the present invention reduces variations in wire lengths in the wiring areas, shortens wires in the wiring areas, relaxes the congestion of wires in the wiring areas, and makes the wiring areas smaller.

The present invention is not limited to a semiconductor device consisting of a circuit board, main chip, subchip, and interface circuits. The present invention is applicable to a semiconductor device consisting of a circuit board, a main board having chips and arranged on one surface of the circuit board, and a subboard having chips and arranged on the other surface of the circuit board. This device arranges interface chips at central parts of four sides of the main board, respectively, to interface the main board and the subboard with each other.

DETAILED DESCRIPTION OF THE EMBODIMENT

Figure 1:
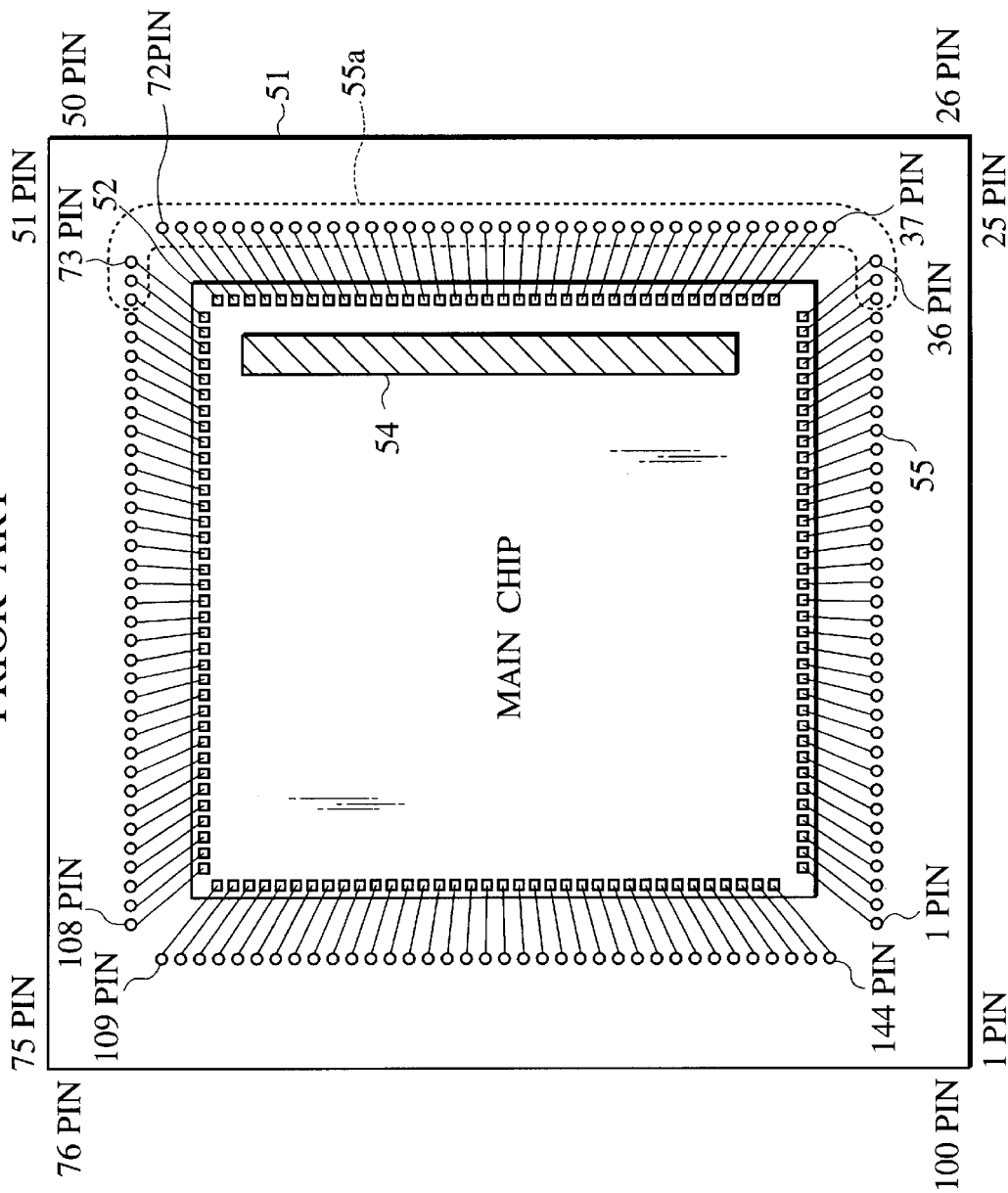
FIG. 1 is a plan view showing the top surface of a double-sided multi-chip package device according to a prior art.
Figure 2:
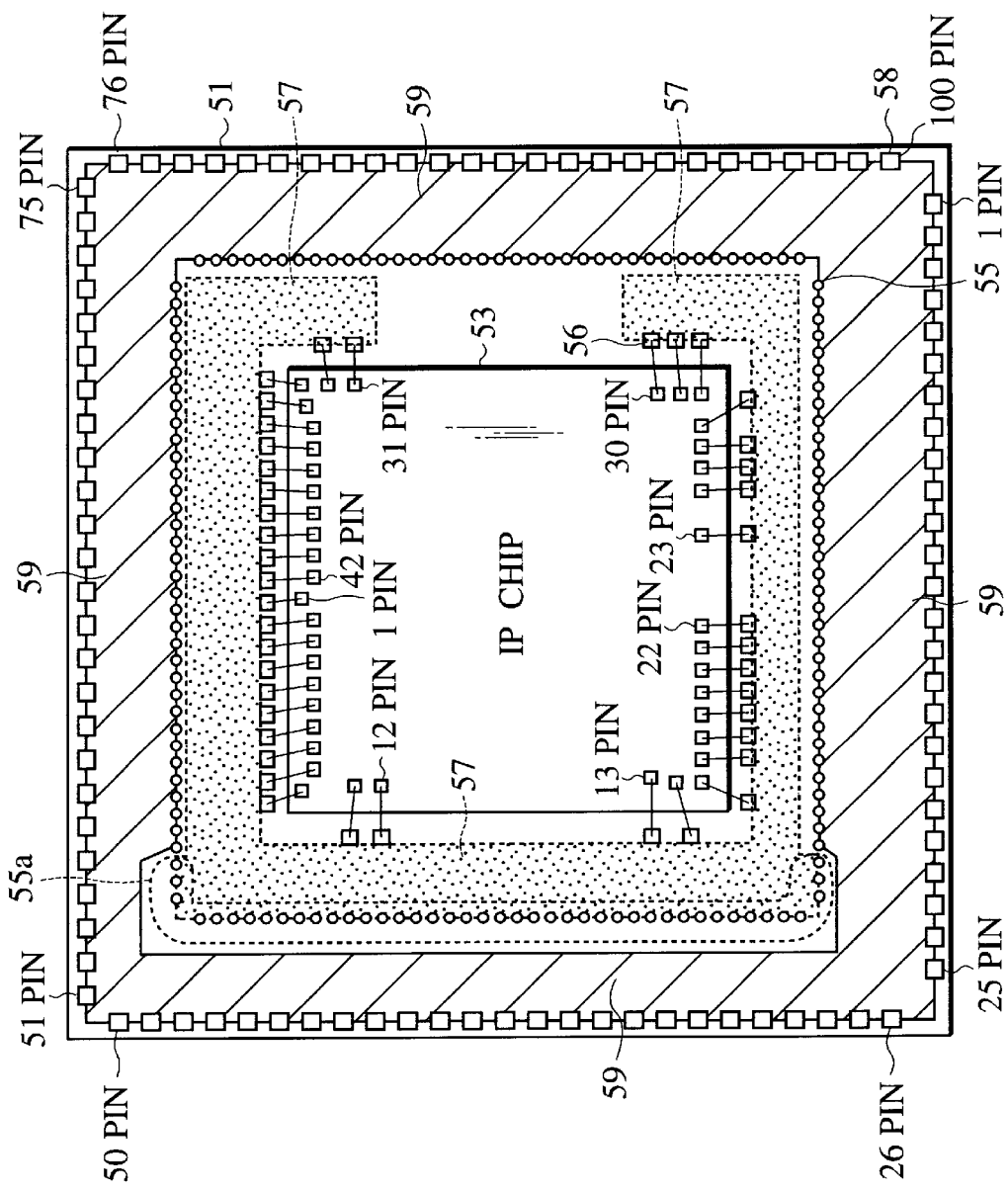
FIG. 2 is a plan view showing the bottom surface of the device of FIG. 1.
Figure 3:
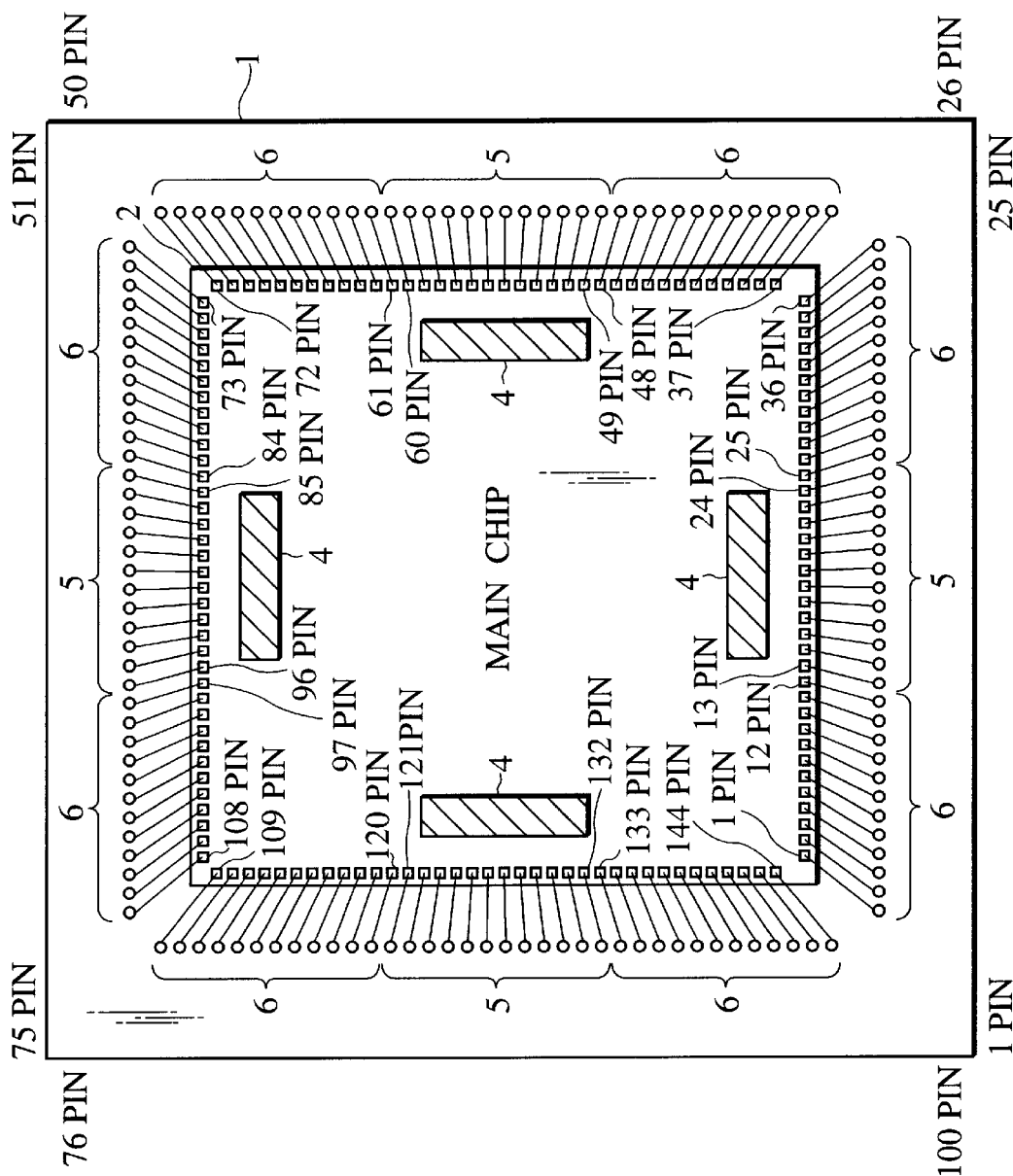
FIG. 3 is a plan view showing the top surface of a double-sided multi-chip package device according to an embodiment of the present invention.
Figure 4:
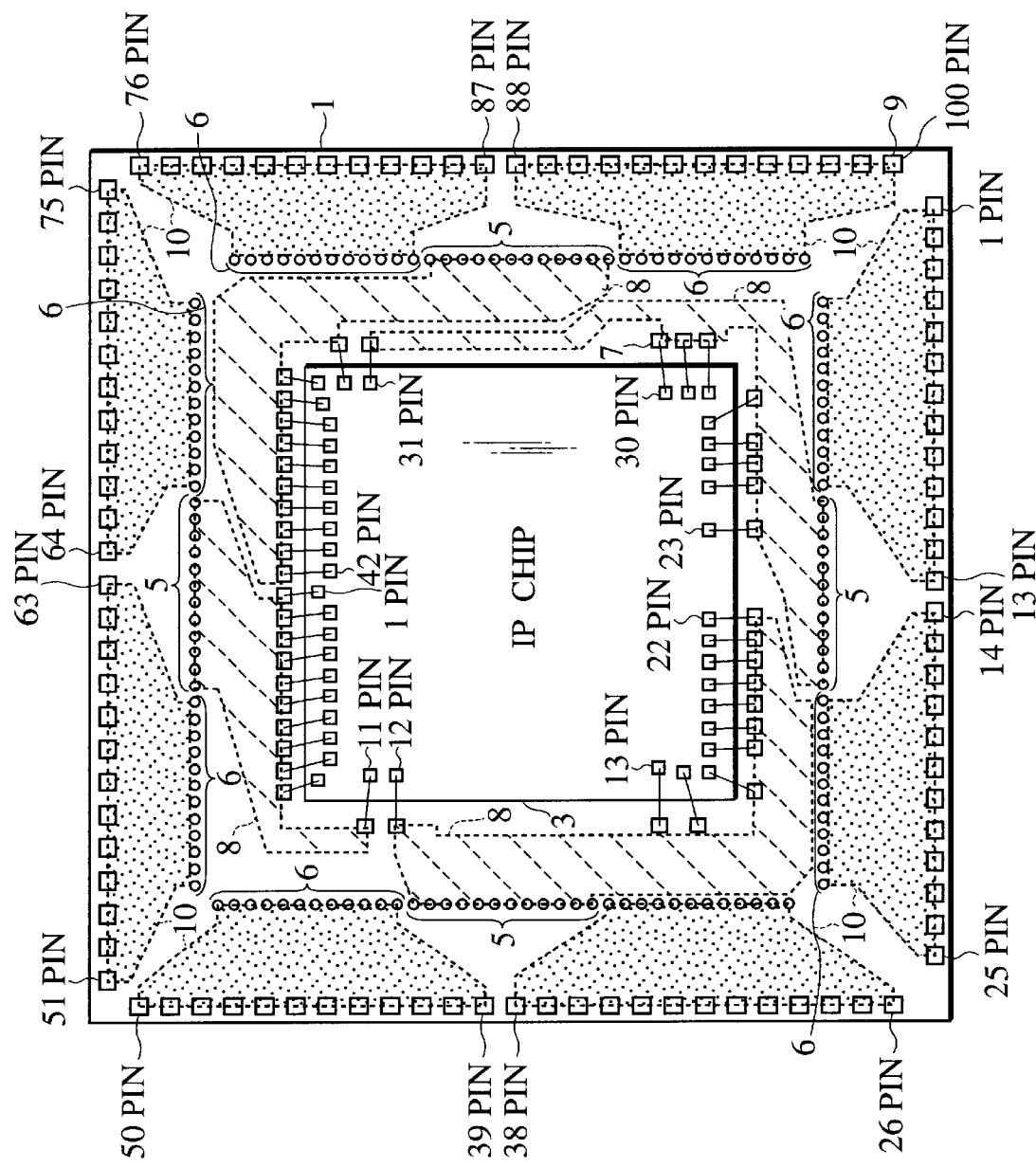
FIG. 4 is a plan view showing the bottom surface of the device of FIG. 3.

A semiconductor device employing a double-sided MCP (multi-chip package) according to an embodiment of the present invention will be explained with reference to FIGS. 3 and 4, in which FIG. 3 shows the top of a circuit board of the MCP device and FIG. 4 shows the bottom thereof.

The circuit board 1 has a main chip 2 on the top surface thereof and a subchip 3 on the bottom surface thereof. The subchip 3 may be an IP (intellectual property) chip. Inside the main chip 2, an interface circuit 4 is arranged at the central part of each of four sides of the main chip 2, to interface the main chip 2 and IP chip 3 with each other. IP chip connecting terminals 5 are arranged around the main chip 2 opposite to the interface circuits 4 on each surface of the circuit board 1, to connect the interface circuits 4 and IP chip 3 to each other through the circuit board 1. Main-chip connecting terminals 6 are arranged around the main chip 2 at positions where the terminals 5 are not present on each surface of the circuit board 1, to connect the main chip 2 to the outside through the circuit board 1.

IP chip bonding terminals 7 are arranged around the IP chip 3 on the bottom surface of the circuit board 1 and are connected to the IP chip 3 with bonding wires. A first wiring area 8 is formed between the terminals 7 and the terminals 5 and 6, to connect the terminals 7 and 5 to each other. Package terminals 9 are arranged along the periphery of the bottom surface of the circuit board 1, to connect the MCP device to the outside. A second wiring area 10 is formed between the terminals 9 and 6, to connect the terminals 9 and 6 to each other.

In the main chip 2, the interface circuits 4 are distributed to the central parts of the four sides of the main chip 2, respectively. As a result, the IP chip connecting terminals 5 are distributed, on the external side of the main chip 2, to the central parts of the four sides of the main chip 2. On the bottom surface of the circuit board 1, the first wiring area 8 for connecting the terminals 7 and 5 to each other is also distributed along the periphery of the IP chip 3, to shorten wire lengths and make wiring easier. The second wiring area 10 for connecting the terminals 6 and 9 to each other is distributed along the periphery of the IP chip 3, to make wiring easier. This arrangement suppresses variations among wire lengths, shortens wire lengths, relaxes wiring congestion, and reduces the size of each wiring area. Then, it will be easy to optimize wire lengths and wiring designing on a circuit board. Reducing wiring areas shrinks the size of a circuit board on which chips are installed. Shortening wire lengths reduces wiring capacitance and resistance, to improve circuit operating speed.

In summary, the present invention provides a double-sided multi-chip package device that arranges interface circuits in a main chip at central parts of four sides of the main chip, respectively, to make the designing of wiring for a subchip, subchip connecting terminals, main-chip connecting terminals, and package terminals easier. This arrangement shortens wire lengths and reduces wiring capacitance and resistance, to improve circuit operating speed. The arrangement also reduces wiring areas, thereby reducing the size of a circuit board.

The present invention is not limited to a semiconductor device consisting of a circuit board, main chip, subchip, and interface circuits. The present invention is applicable to a semiconductor device consisting of a circuit board, a main board having chips and arranged on one surface of the circuit board, and a subboard having chips and arranged on the other surface of the circuit board. This device arranges interface chips at central parts of four sides of the main board, respectively, to interface the main board and the subboard with each other.

What is claimed is:

1. A semiconductor device comprising:

a circuit board;

a main chip mounted on a first surface of the circuit board;

a sub-chip mounted on a second surface of the circuit board;

interface circuits distributed in the main chip along plural sides of the main chip, respectively, to interface the main chip and the sub-chip with each order;

sub-chip connecting terminals arranged around the main chip opposite to the interface circuits on each surface of the circuit board, to connect the interface circuits and the sub-chip to each other through the circuit board;

sub-chip bonding terminals arranged around the sub-chip on the second surface of the circuit board and connected to the sub-chip; and first wiring areas connecting the sub-chip bonding terminals and the sub-chip connecting terminals to each other.

2. The semiconductor device of claim 1, farther comprising:

main-chip connecting terminals arranged around the main chip at positions where the sub-chip connecting terminals are not present on each surface of the circuit board, to connect the main chip to the outside;

package terminals arranged along the periphery of the circuit board, to connect the main chip to the outside; and second wiring areas for connecting the package terminals and the main-chip connecting terminals to each other.

3. The semiconductor device of claim 1, wherein the interface circuits are arranged at central parts of the plural sides of the main board, respectively.

4. The semiconductor device of claim 2, wherein the package terminals are arranged on the second surface of the circuit board.

5. A semiconductor device comprising:

a circuit board;

a main board mounted on a first surface of the circuit board;

a sub-board mounted on a second surface of the circuit board;

interface chips distributed on the main board along plural sides of the main board, respectively, to interface the main board and the sub-board with each other;

sub-board connecting terminals arranged around the main board opposite to the interface chips on each surface of the circuit board, to connect the interface chips and the sub-board to each other through the circuit board;

sub-board bonding terminals arranged around the sub-board on the second surface of the circuit board and connected to the sub-board; and first wiring areas connecting the sub-board bonding terminals and the sub-board connecting terminals to each other.

6. The semiconductor device of claim 5, further comprising:

main-board connecting terminals arranged around the main board at positions where the sub-board connecting terminals are not present on each surface of the circuit board, to connect the main board to the outside;

package terminals arranged along the periphery of the circuit board, to connect the main board to the outside; and second wiring areas connecting the package terminals and the main-board connecting terminals to each other.

7. The semiconductor device of claim 5, wherein the interface chips are arranged at central parts of the plural sides of the main board, respectively.

8. The semiconductor device of claim 6, wherein the package terminals are arranged on the second surface of the circuit board.

9. A double-sided multi-chip package device comprising:

a circuit board;

a main chip mounted on a first surface of the circuit board;

a sub-chip mounted on a second surface of the circuit board;

interface circuits distributed in the main chip along plural sides of the main chip, respectively, to interface the main chip and the sub-chip with each other;

sub-chip connecting terminals arranged around the main chip opposite to the interface circuits on each surface of the circuit board, to connect the interface circuits and the sub-chip to each other through the circuit board;

sub-chip bonding terminals arranged around the sub-chip on the second surface of the circuit board and connected to the sub-chip; and first wiring areas connecting the sub-chip bonding terminals and the sub-chip connecting terminals to each other.

10. The device of claim 9, further comprising:

main-chip connecting terminals arranged around the main chip at positions where the sub-chip connecting terminals are not present on each surface of the circuit board, to connect the main chip to the outside;

package terminals arranged along the periphery of the circuit board, to connect the main chip to the outside; and second wiring areas connecting the package terminals and the main-chip connecting terminals to each other.

11. The semiconductor device of claim 9, wherein the interface circuits are arranged at central parts of the plural sides of the main board, respectively.

12. The device of claim 10, wherein the package terminals are arranged on the second surface of the circuit board.

13. A double-sided multi-chip package device comprising:

a circuit board;

a main board mounted on a first surface of the circuit board;

a sub-board mounted on a second surface of the circuit board;

interface chips distributed on the main board along plural sides of the main board, respectively, to interface the main board and the sub-board with each other;

sub-board connecting terminals arranged around the main board opposite to the interface chips on each surface of the circuit board, to connect the interface chips and the sub-board to each other through the circuit board;

sub-board bonding terminals arranged around the sub-board on the second surface of the circuit board and connected to the sub-board; and first wiring areas connecting the sub-board bonding terminals and the sub-board connecting terminals to each other.

14. The device of claim 13, further comprising:

main-board connecting terminals arranged around the main board at positions where the sub-board connecting terminals are not present on each surface of the circuit board, to connect the main board to the outside;

package terminals arranged along the periphery of the circuit board, to connect the main board to the outside; and second wiring areas connecting the package terminals and the main-board connecting terminals to each other.

15. The semiconductor device of claim 13, wherein the interface chips are arranged at central parts of the plural sides of the main board, respectively.

16. The device of claim 14, wherein the package terminals are arranged on the second surface of the circuit board.

17. The semiconductor device of claim 1, wherein three interface circuits are distributed along three sides of the main chip, respectively.

18. The semiconductor device of claim 1, wherein two interface circuits are distributed along sides of the main chip, respectively.

19. The semiconductor device of claim 5, wherein three interface chips are distributed along three sides of the main board, respectively.

20. The semiconductor device of claim 5, wherein two interface chips are distributed along two sides of the main board, respectively.

21. The device of claim 14, wherein three interface circuits are distributed along three sides of the main chip, respectively.

22. The device of claim 14, wherein two interface circuits are distributed along two sides of the main chip, respectively.

23. The device of claim 13, wherein three interface chips are distributed along three sides of the main board, respectively.

24. The device of claim 13, wherein two interface chips are distributed along two sides of the main board, respectively.

* * * * *